United States Patent
Ha et al.

(10) Patent No.: US 10,476,438 B2
(45) Date of Patent: Nov. 12, 2019

(54) ENVELOPE TRACKING BIAS CIRCUIT

(71) Applicant: Samsung Electro-Mechanics Co., Ltd., Suwon-si (KR)

(72) Inventors: Jong Ok Ha, Suwon-si (KR); Byeong Hak Jo, Suwon-si (KR); Jeong Hoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/984,664

(22) Filed: May 21, 2018

(65) Prior Publication Data
US 2019/0068122 A1 Feb. 28, 2019

(30) Foreign Application Priority Data

Aug. 24, 2017 (KR) .................. 10-2017-0107437

(51) Int. Cl.
*H03F 1/02* (2006.01)
*H03F 1/30* (2006.01)
(Continued)

(52) U.S. Cl.
CPC ......... *H03F 1/0205* (2013.01); *H03F 1/0261* (2013.01); *H03F 1/301* (2013.01); *H03F 3/193* (2013.01); *H03F 3/21* (2013.01); *H03F 3/45273* (2013.01); *H03F 3/45475* (2013.01); *H03F 3/45973* (2013.01); *H03F 2200/102* (2013.01); *H03F 2200/18* (2013.01);
(Continued)

(58) Field of Classification Search
CPC ...................................................... H03F 1/0205
See application file for complete search history.

(56) References Cited

U.S. PATENT DOCUMENTS 5,003,414 A * 3/1991 Yokozawa ............. G11B 5/588
360/77.14
6,141,169 A * 10/2000 Pietruszynski .. G11B 20/10009
330/260
(Continued)

FOREIGN PATENT DOCUMENTS

JP 2015-185863 A 10/2015

OTHER PUBLICATIONS

Korean Office Action dated Jul. 18, 2018 in Korean Patent Application No. 10-2017-0107437 (5 pages in English, 5 pages in Korean).

*Primary Examiner* — Patricia T Nguyen
(74) *Attorney, Agent, or Firm* — NSIP Law

(57) ABSTRACT

An envelope tracking (ET) bias circuit includes an envelope tracking (ET) bias circuit includes an envelope detection circuit, an envelope amplifier circuit, and an envelope output circuit. The envelope detection circuit is configured to detect an envelope of an input signal, and output an envelope signal based on the detected envelope of the input signal. The envelope amplifier circuit is configured to differentially amplify the envelope signal in response to a first control signal and cancel a direct current (DC) offset of the envelope signal to output an amplified signal from which the DC offset is canceled. The envelope output circuit is configured to generate an ET bias current by selecting either one of a negative signal of the amplified signal and a positive signal of the amplified signal in response to a second control signal.

22 Claims, 8 Drawing Sheets

(51) Int. Cl.
*H03F 3/45* (2006.01)
*H03F 3/21* (2006.01)
*H03F 3/193* (2006.01)

(52) U.S. Cl.
CPC .............. *H03F 2203/45151* (2013.01); *H03F 2203/45178* (2013.01); *H03F 2203/45512* (2013.01); *H03F 2203/45526* (2013.01); *H03F 2203/45528* (2013.01)

(56) References Cited

U.S. PATENT DOCUMENTS

| | | |
|---|---|---|
| 7,005,923 B2 | 2/2006 | Noh et al. |
| 7,135,918 B1 * | 11/2006 | Outaleb ................ H03F 1/0211 330/10 |
| 7,768,346 B1 * | 8/2010 | Terrovitis ............. H03G 3/3042 330/129 |
| 8,106,712 B2 | 1/2012 | Lee et al. |
| 8,665,018 B2 | 3/2014 | Strange et al. |
| 10,135,472 B1 * | 11/2018 | Ashry Othman .... H04B 1/0475 |
| 2009/0174456 A1 * | 7/2009 | Yanagisawa ......... H04B 1/0475 327/307 |
| 2016/0126901 A1 | 5/2016 | Knopik |
| 2018/0076772 A1 * | 3/2018 | Khesbak ............... H03F 1/0227 |

* cited by examiner

ENVELOPE TRACKING BIAS CIRCUIT

CROSS-REFERENCE TO RELATED APPLICATION

This application claims the benefit under 35 USC 119(a) of Korean Patent Application No. 10-2017-0107437 filed on Aug. 24, 2017 in the Korean Intellectual Property Office, the entire disclosure of which is incorporated herein by reference for all purposes.

BACKGROUND

1. Field

The following description relates to an envelope tracking bias circuit.

2. Description of Related Art

In general, a power amplifier (PA) serves to amplify radio frequency (RF) signals in a radio communication band to be transmitted by an antenna. The PA of a portable device, such as a smartphone, typically uses a larger amount of current than other components in the portable device and should satisfy high linearity requirements.

There are various methods for improving PA characteristics. Among such methods, as a method for improving characteristics of amplitude modulation (AM)/AM, AM/phase modulation (PM), and the like of the PA, there is a method for providing an envelope signal of the RF signal applied to the PA to a bias.

A bias voltage in a PA core cell may be provided in a form of sourcing or sinking voltage determined by a circuit structure of a PA integrated circuit (IC), and a magnitude of an envelope tracking (ET) bias provided to an ET core may also be varied depending on an operation and a circuit structure of the PA.

Conventionally, an envelope signal may not be matched to characteristics of the PA because conventional envelope tracking bias circuits provide the envelope signal without considering characteristics of the PA. Thus, the performance suitable for characteristics of the PA may not be exhibited by conventional means.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an envelope tracking (ET) bias circuit includes an envelope detection circuit, an envelope amplifier circuit, and an envelope output circuit. The envelope detection circuit is configured to detect an envelope of an input signal, and output an envelope signal based on the detected envelope of the input signal. The envelope amplifier circuit is configured to differentially amplify the envelope signal in response to a first control signal and cancel a direct current (DC) offset of the envelope signal to output an amplified signal from which the DC offset is canceled. The envelope output circuit is configured to generate an ET bias current by selecting either one of a negative signal of the amplified signal and a positive signal of the amplified signal in response to a second control signal.

The envelope signal output by the envelope detection circuit may be a differential envelope signal. The envelope amplifier circuit may include an amplifier and a DC offset cancelling circuit. The amplifier may be configured to differentially amplify the differential envelope signal to output a differential amplified signal. The DC offset cancelling circuit may be configured to provide the amplified signal from the amplifier to an input terminal of the amplifier to cancel the DC offset from the amplified signal output from the amplifier.

The envelope signal of the envelope detection circuit may be a single envelope signal. The envelope amplifier circuit may include a single/differential circuit, an amplifier, and a DC offset cancelling circuit. The single/differential circuit may be configured to convert the single envelope signal into a differential envelope signal. The amplifier may be configured to differentially amplify the differential envelope signal from the single/differential circuit to output a differential amplified signal. The DC offset cancelling circuit may be configured to provide the amplified signal from the amplifier to an input terminal of the amplifier to cancel the DC offset from the amplified signal output from the amplifier.

The amplifier may include a first amplifier having a non-inverting input terminal configured to receive a first signal of the differential envelope signal through a first resistor, and an inverting input terminal configured to receive a second signal of the differential envelope signal through a second resistor. The first amplifier may receive a second signal of a DC offset cancel signal from the DC offset cancelling circuit through a third resistor and the non-inverting input terminal, and receive a first signal of the DC offset cancel signal through a fourth resistor and the inverting input terminal. The first amplifier may include a fifth resistor, a sixth resistor, a first capacitor, and a second capacitor. The fifth resistor may be connected between the non-inverting input terminal and a second output terminal. The sixth resistor may be connected between the inverting input terminal and a first output terminal. The first capacitor may be connected between the non-inverting input terminal and the second output terminal. The second capacitor may be connected between the inverting input terminal and the first output terminal.

The amplifier may include a first amplifier having a non-inverting input terminal configured to receive a first signal of the differential envelope signal through a first resistor, and an inverting input terminal configured to receive a second signal of the differential envelope signal through a second resistor. The first amplifier may receive a second signal of a DC offset cancel signal from the DC offset cancelling circuit through a third resistor and the non-inverting input terminal, and receive a first signal of the DC offset cancel signal through a fourth resistor and the inverting input terminal. The first amplifier may include a fifth resistor, a sixth resistor, a first capacitor, and a second capacitor. The fifth resistor may be connected between the non-inverting input terminal and a second output terminal. The sixth resistor may be connected between the inverting input terminal and a first output terminal. The first capacitor may be connected between the non-inverting input terminal and the second output terminal. The second capacitor may be connected between the inverting input terminal and the first output terminal.

The DC offset cancelling circuit may include a second amplifier having a non-inverting input terminal connected to a first output terminal of the amplifier through first and second resistors, and an inverting input terminal connected to a second output terminal of the amplifier through third and fourth resistors. The second amplifier may provide a DC offset bias voltage through fifth and sixth resistors connected between a connection node of the first and second resistors and a connection node of the third and fourth resistors. The second amplifier may include a first capacitor and a second capacitor. The first capacitor may be connected between the non-inverting input terminal and a second output terminal of the DC offset cancelling circuit. The second capacitor may be connected between the inverting input terminal and a first output terminal of the DC offset cancelling circuit.

The DC offset cancelling circuit may include a second amplifier having a non-inverting input terminal connected to a first output terminal of the amplifier through first and second resistors, and an inverting input terminal connected to a second output terminal of the amplifier through third and fourth resistors. The second amplifier may provide a DC offset bias voltage through fifth and sixth resistors connected between a connection node of the first and second resistors and a connection node of the third and fourth resistors. The second amplifier may include a first capacitor and a second capacitor. The first capacitor may be connected between the non-inverting input terminal and a second output terminal of the DC offset cancelling circuit. The second capacitor may be connected between the inverting input terminal and a first output terminal of the DC offset cancelling circuit.

The envelope output circuit may include a selection circuit and an ET sourcing/sinking circuit. The selection circuit may be configured to select either one of a first signal and a second signal of the amplified signal in response to the second control signal. The ET sourcing/sinking may be circuit configured to generate an ET bias current based on the selected one of the first signal and the second signal.

The envelope output circuit may include a selection circuit and an ET sourcing/sinking circuit. The selection circuit may be configured to select either one of a first signal and a second signal of the amplified signal in response to the second control signal. The ET sourcing/sinking circuit may be configured to generate an ET bias current based on the selected one of the first signal and the second signal.

The ET sourcing/sinking circuit may include an ET current generation circuit and a DC bias cancel circuit. The ET current generation circuit may be configured to convert a voltage selected by the selection circuit into an ET bias current and adjust the ET bias current in response to the second control signal. The DC bias cancel circuit may be configured to convert the DC offset bias voltage into the ET bias current and cancel the direct current from the ET bias current.

The ET sourcing/sinking circuit may include an ET current generation circuit and a DC bias cancel circuit. The ET current generation circuit may be configured to convert a voltage selected by the selection circuit into an ET bias current and adjust the ET bias current in response to the second control signal. The DC bias cancel circuit may be configured to convert the DC offset bias voltage into the ET bias current and cancel the direct current from the ET bias current.

In another general aspect, an envelope tracking (ET) bias circuit includes an envelope detection circuit, an envelope amplifier circuit, an envelope output circuit, and a control circuit. The envelope detection circuit is configured to detect an envelope from an input signal and output an envelope signal based on the detected envelope of the input signal. The envelope amplifier circuit is configured to differentially amplify the envelope signal in response to a first control signal, and cancel a direct current (DC) offset of the envelope signal to output an amplified signal from which the DC offset is canceled. The envelope output circuit is configured to generate an ET bias current b selecting either one of a negative signal of the amplified signal and a positive signal of the amplified signal in response to the second control signal. The control circuit is configured to generate the first control signal and the second control signal to control the envelope amplifier circuit and the envelope output circuit based on a characteristic parameter factor of a power amplifier.

The envelope signal of the envelope detection circuit may be a differential envelope signal. The envelope amplifier circuit may include an amplifier and a DC offset cancelling circuit. The amplifier may be configured to differentially amplify the differential envelope signal to output a differential amplified signal. The DC offset cancelling circuit may be configured to provide the amplified signal from the amplifier to an input terminal of the amplifier to cancel the DC offset from the amplified signal output from the amplifier.

The envelope signal of the envelope detection circuit may be a single envelope signal. The envelope amplifier circuit may include a single/differential circuit, an amplifier, and a DC offset cancelling circuit. The single/differential circuit may be configured to convert the single envelope signal into a differential envelope signal. The amplifier may be configured to differentially amplify the differential envelope signal from the single/differential circuit to output a differential amplified signal. The DC offset cancelling circuit may be configured to provide the amplified signal from the amplifier to an input terminal of the amplifier to cancel the DC offset from the amplified signal output from the amplifier.

The amplifier may include a first amplifier having a non-inverting input terminal configured to receive a first signal of the differential envelope signal through a first resistor, and an inverting input terminal configured to receive a second signal of the differential envelope signal through a second resistor. The first amplifier may receive a second signal of a DC offset cancel signal from the DC offset cancelling circuit through a third resistor and the non-inverting input terminal, and receive a first signal of the DC offset cancel signal through a fourth resistor and the inverting input terminal. The first amplifier may include a fifth resistor, a sixth resistor, a first capacitor, and a second capacitor. The fifth resistor may be connected between the non-inverting input terminal and a second output terminal. The sixth resistor may be connected between the inverting input terminal and a first output terminal. The first capacitor may be connected between the non-inverting input terminal and the second output terminal. The second capacitor may be connected between the inverting input terminal and the first output terminal.

The amplifier may include a first amplifier having a non-inverting input terminal configured to receive a first signal of the differential envelope signal through a first resistor, and an inverting input terminal configured to receive a second signal of the differential envelope signal through a second resistor. The first amplifier may receive a second signal of a DC offset cancel signal from the DC offset cancelling circuit through a third resistor and the non-inverting input terminal, and receive a first signal of the DC offset cancel signal through a fourth resistor and the inverting input terminal. The first amplifier may include a fifth resistor, a sixth resistor, a first capacitor, and a second capacitor. The fifth resistor may be connected between the non-inverting input terminal and a second output terminal. The sixth resistor may be connected between the inverting input terminal and a first output terminal. The first capacitor may be connected between the non-inverting input terminal and the second output terminal. The second capacitor may be connected between the inverting input terminal and the first output terminal.

The DC offset cancelling circuit may include a second amplifier having a non-inverting input terminal connected to a first output terminal of the amplifier through first and second resistors, and an inverting input terminal connected to a second output terminal of the amplifier through third and fourth resistors. The second amplifier may provide a DC offset bias voltage through fifth and sixth resistors connected between a connection node of the first and second resistors and a connection node of the third and fourth resistors. The second amplifier may include a first capacitor and a second capacitor. The first capacitor may be connected between the non-inverting input terminal and a second output terminal of the DC offset cancelling circuit. The second capacitor may be connected between the inverting input terminal and a first output terminal of the DC offset cancelling circuit.

The DC offset cancelling circuit may include a second amplifier having a non-inverting input terminal connected to a first output terminal of the amplifier through first and second resistors, and an inverting input terminal connected to a second output terminal of the amplifier through third and fourth resistors. The second amplifier may provide a DC offset bias voltage through fifth and sixth resistors connected between a connection node of the first and second resistors and a connection node of the third and fourth resistors. The second amplifier may include a first capacitor and a second capacitor. The first capacitor may be connected between the non-inverting input terminal and a second output terminal of the DC offset cancelling circuit. The second capacitor may be connected between the inverting input terminal and a first output terminal of the DC offset cancelling circuit.

The envelope output circuit may include a selection and an ET sourcing/sinking circuit. The selection circuit may be configured to select either one of a first signal and a second signal of the amplified signal in response to the second control signal. The ET sourcing/sinking circuit may be configured to generate an ET bias current based on the selected one of the first signal and the second signal.

The envelope output circuit may include a selection circuit and an ET sourcing/sinking circuit. The selection circuit may be configured to select either one of a first signal and a second signal of the amplified signal in response to the second control signal. The ET sourcing/sinking circuit may be configured to generate an ET bias current based on the selected one of the first signal and the second signal.

The ET sourcing/sinking circuit may include an ET current generation circuit an ET current generation circuit and a DC bias cancel circuit. The ET current generation circuit may be configured to convert a voltage selected by the selection circuit into an ET bias current and adjust the ET bias current in response to the second control signal. The DC bias cancel circuit configured to convert the DC offset bias voltage into the ET bias current and cancel the direct current from the ET bias current.

The ET sourcing/sinking circuit may include an ET current generation circuit and a DC bias cancel circuit. The ET current generation circuit may be configured to convert a voltage selected by the selection circuit into an ET bias current and adjust the ET bias current in response to the second control signal. The DC bias cancel circuit may be configured to convert the DC offset bias voltage into the ET bias current and cancel the direct current from the ET bias current.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
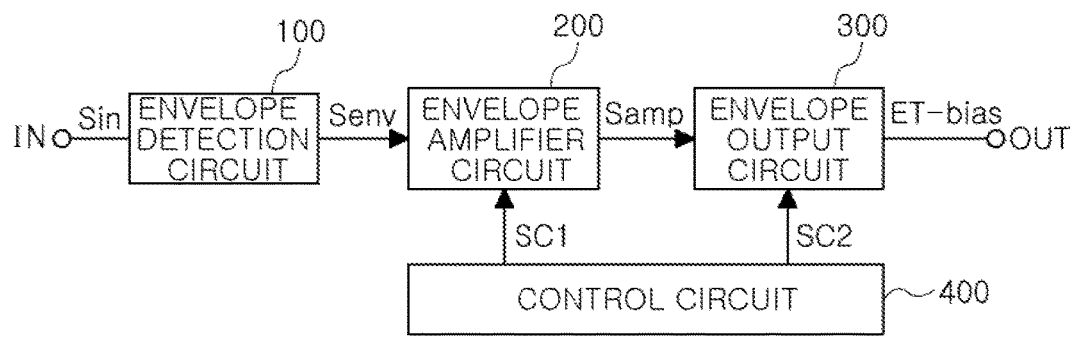
FIG. 1 is a schematic view of an example of an envelope tracking bias circuit.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic view of an example of an envelope tracking bias circuit according to the present disclosure.

Referring to FIG. 1, an envelope tracking bias circuit may include an envelope detection circuit 100, an envelope amplifier circuit 200, and an envelope output circuit 300.

In addition, the envelope tracking bias circuit may further include a control circuit 400.

The envelope detection circuit 100 detects an envelope from an input signal Sin input thereto and output an envelope signal Senv. Here, the input signal Sin may be a radio frequency (RF) signal and may be an operation voltage VCC based on the envelope of the RF signal, but is not limited thereto.

The envelope amplifier circuit 200 may differentially amplify the envelope signal Senv in response to a first control signal SC1, and may cancel a direct current (DC) offset of the envelope signal to output an amplified signal Samp from which the DC offset is cancelled.

The envelope output circuit 300 may generate an ET bias current ET_bias based on a signal selected from a negative signal and a positive signal of the amplified signal Samp in response to a second control signal SC2.

As an example, the envelope output circuit 300 converts the ET bias current ET_bias into a voltage and provide the converted voltage. Therefore, the envelope output circuit 300 may appropriately supply an ET bias depending on whether the ET bias required by a power amplifier circuit to which the envelope output circuit 300 is applied is a current or a voltage.

In addition, the control circuit 400 may include a characteristic parameter factor of a power amplifier PA and provide the first control signal SC1 and the second control signal SC2 based on the characteristic parameter factor to control the envelope amplifier circuit 200 and the envelope output circuit 300.

As an example, the characteristic parameter factor may be determined according to operation characteristics of the power amplifier PA, and the operation characteristics of the power amplifier may be at least one of a frequency band, a gain, an output power, a bandwidth, and a power mode for the power amplifier.

Regarding respective drawings of the present disclosure, unnecessarily overlapped descriptions may be omitted for components having the same reference numeral and the same function, and only differences in the respective drawings will be described.

Figure 2:
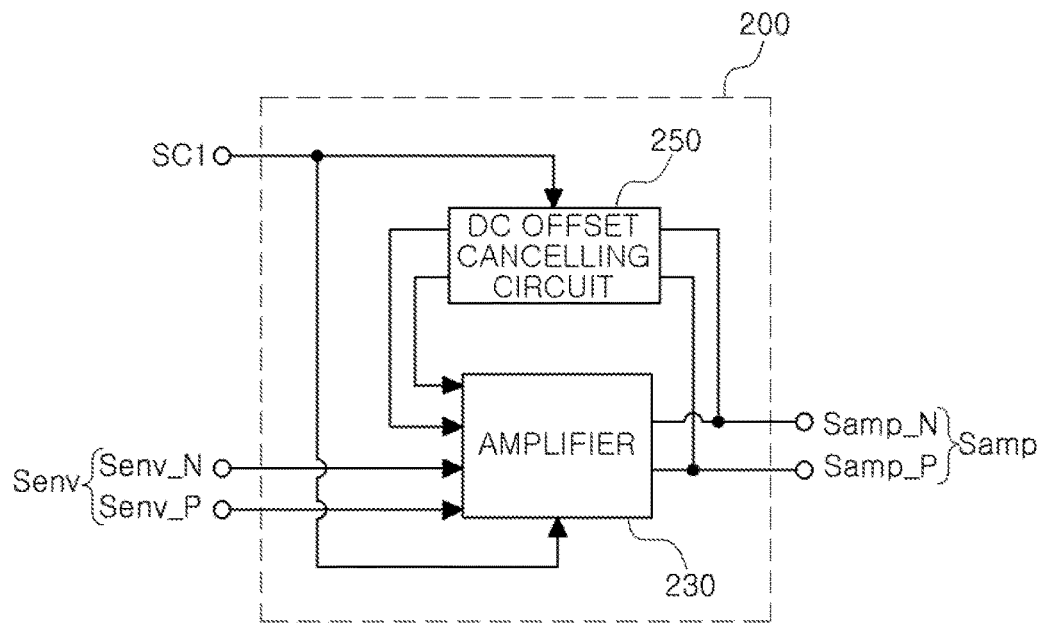
FIG. 2 is a schematic view of an example of an envelope amplifier circuit.

FIG. 2 is a schematic view of an example of an envelope amplifier circuit according to the present disclosure.

Referring to FIGS. 1 and 2, as an example, the envelope signal Senv of the envelope detection circuit 100 may be a differential envelope signal Senv (Senv_P, Senv_N).

As an example, the envelope amplifier circuit 200 may include an amplifier 230 and a DC offset cancelling circuit 250.

The amplifier 230 may differentially amplify the differential envelope signal Senv (Senv_P, Senv, N) to output a differential amplified signal Samp (Samp_P, Samp_N). Here, a bandwidth FbwH (FIG. 6) of the amplifier 230 may be adjusted according to the first control signal SC1.

The DC offset cancelling circuit 250 may provide the amplified signal Samp from the amplifier 230 to an input terminal of the amplifier 230. In this case, the DC offset cancelling circuit 250 may adjust a frequency band Fbw_dcos (FIG. 7) of the signal provided to the input terminal of the amplifier 230 according to the first control signal SC1 and may cancel a DC offset from the amplified signal Samp output from the amplifier 230.

Figure 3:
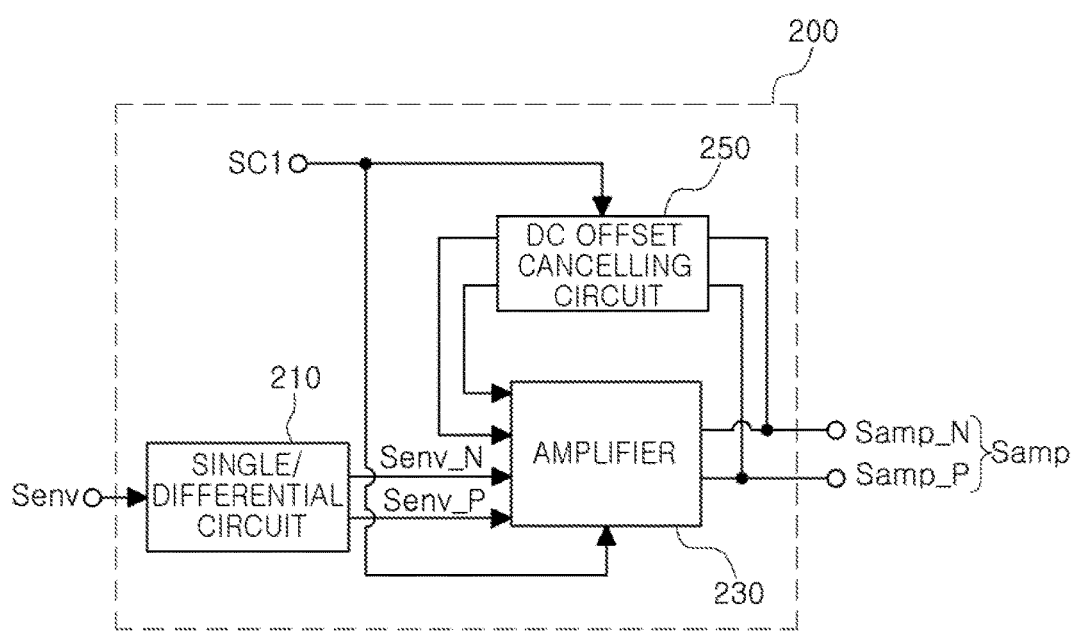
FIG. 3 is another schematic view of an example of an envelope amplifier apparatus.

FIG. 3 is another schematic view of an example of an envelope amplifier apparatus according to the present disclosure.

Referring to FIGS. 1 and 3, as an example, the envelope signal Senv of the envelope detection circuit 100 may be a single envelope signal Senv.

As an example, the envelope amplifier circuit 200 may include a single/differential circuit 210, the amplifier 230, and the DC offset cancelling circuit 250.

The single/differential circuit 210 may convert the signal envelope signal Senv into the differential envelope signal Senv (Senv_P, Senv_N). For example, as the single/differential circuit 210, any circuit may be used as long as it may convert a single signal into a differential signal.

The amplifier 230 may differentially amplify the differential envelope signal Senv (Senv_P, Senv, N) from the single/differential circuit 210 to output the differential amplified signal Samp (Samp_P, Samp_N). Here, a bandwidth FbwH (FIG. 6) of the amplifier 230 may be adjusted according to the first control signal SC1.

The DC offset cancelling circuit 250 may provide the amplified signal Samp from the amplifier 230 to an input terminal of the amplifier 230. In this case, the DC offset cancelling circuit 250 may adjust a frequency band Fbw_dcos (FIG. 7) of the signal provided to the input terminal of the amplifier 230 according to the first control signal SC1 and may cancel a DC offset from the amplified signal Samp output from the amplifier 230.

Referring to FIGS. 2 and 3, the envelope amplifier circuit 200 may output the amplified signal Samp from which the DC offset is cancelled.

Figure 4:
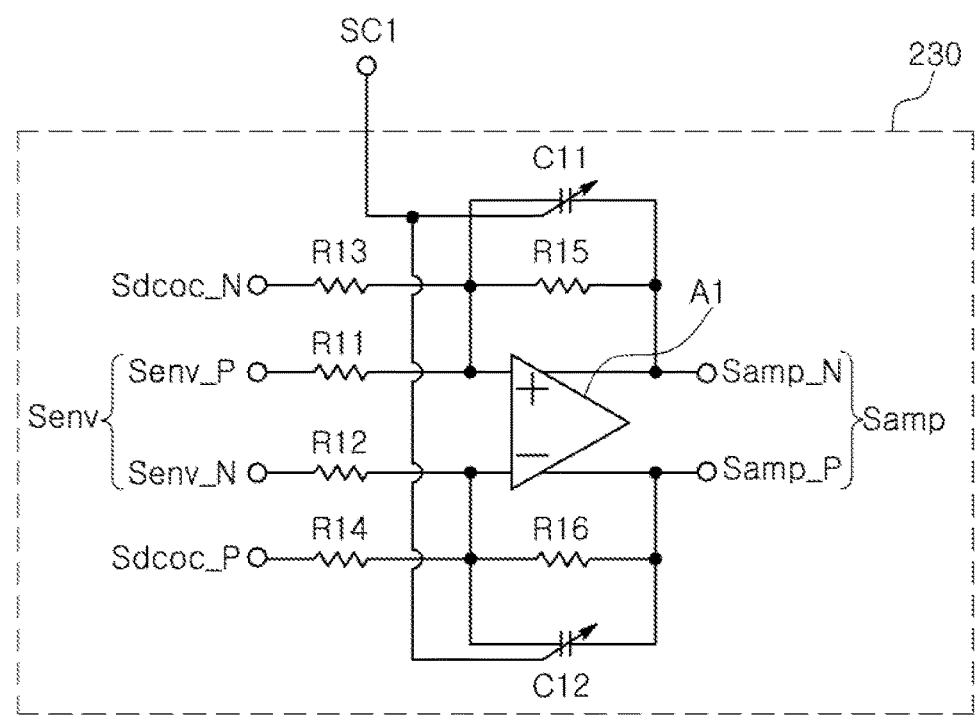
FIG. 4 is a schematic view of an example of an amplifier.

FIG. 4 is a schematic view of an example of an amplifier according to the present disclosure.

Referring to FIGS. 1 through 4, the amplifier 230 may include a first amplifier A1 having a non-inverting input terminal receiving a first signal Senv_P of the differential envelope signal Senv through a first resistor R11 and an inverting input terminal receiving a second signal Senv_N of the differential envelope signal Senv through a second resistor R12.

The first amplifier A1 may receive a second signal Sdcoc_N of a DC offset cancel signal Sdcoc from the DC offset cancelling circuit 250 through a third resistor R13 and the non-inverting input terminal, and may receive a first signal Sdcoc_P of the DC offset cancel signal Sdcoc through a fourth resistor R14 and the inverting input terminal.

In addition, the first amplifier A1 may include a fifth resistor R15 connected between the non-inverting input terminal and a second output terminal, a sixth resistor R16 connected between the inverting input terminal and a first output terminal, a first capacitor circuit C11 connected between the non-inverting input terminal and the second output terminal, and a second capacitor circuit C12 connected between the inverting input terminal and the first output terminal.

As an example, the first capacitor circuit C11 and the second capacitor circuit C12 may include at least one capacitor element, and may be implemented as circuits in which capacitance is varied according to the first control signal SC1.

In the amplifier 230 illustrated in FIG. 4, the first signal Senv_P of the envelope signal Senv and the second signal Sdcoc_N of the DC offset cancel signal Sdcoc may be added and input to the non-inverting input terminal of the first amplifier A1, which is an operational amplifier, and the second signal Senv_N of the envelope signal Senv and the first signal Sdcoc_P of the DC offset cancel signal Sdcoc may be added and input to the inverting input terminal of the first amplifier A1. Here, the first signal Senv_P and the second signal Senv_N of the envelope signal Senv may have opposite phases, and the first signal Sdcoc_P and the second signal Sdcoc_N of the DC offset cancel signal Sdcoc may also have the opposite phases.

Accordingly, the envelope signal Senv and the DC offset cancel signal Sdcoc may be added to each other in opposite phases at the input terminal of the amplifier 230. As a result, a subtraction operation between the envelope signal Senv and the DC offset cancel signal Sdcoc may be performed.

Referring to FIG. 4, the amplifier 230 may include an adder (or a subtractor) having a general amplifier gain. The amplifier 230 may amplify the envelope signal Senv by an amplification gain (R15/R11) determined by the first resistor R11 and the fifth resistor R15, and may also amplify the DC offset cancel signal Sdcoc by an offset gain determined by the third resistor R13 and the fifth resistor R15.

In addition, since capacitance of the first capacitor circuit C11 may be varied according to the first control signal SC1 and the bandwidth FbwH (FIG. 6) may be determined by the capacitance of the first capacitor circuit C11 and the resistance value of the fifth resistor R15, the bandwidth FbwH (FIG. 6) of the amplifier 230 may be adjusted according to the first control signal SC1.

In addition, the amplifier 230 may have characteristics of a low-pass filter having a bandwidth of 3 dB determined by the fifth resistor R15 and the first capacitor circuit C11. A 3 dB frequency F3 db_amp and the amplified signal Samp of the amplifier 230 may be expressed as in Equation 1.

$$3\ db\_amp = 1/(2\pi * R15 * C11)$$

$$Samp = -Senv*(R15/R11) + Sdcoc*(R15/R13) \quad \text{[Equation 1]}$$

As described above, even though the DC offset signal is included in the envelope signal Senv, amplitude of the DC offset signal may be reduced by an amplification rate of DC offset cancellation in the envelope amplifier circuit 200, and reduced amplitude thereof may be adjusted.

Figure 5:
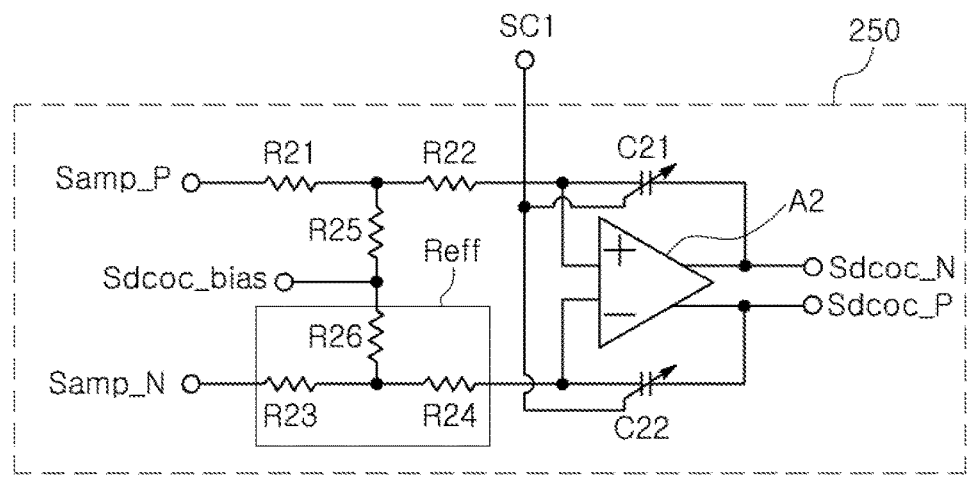
FIG. 5 is a schematic view of an example of a direct current (DC) offset cancelling circuit.

FIG. 5 is a schematic view of an example of a direct current (DC) offset cancelling circuit according to the present disclosure.

Referring to FIGS. 1 through 5, the DC offset cancelling circuit 250 may include a second amplifier A2 having a non-inverting input terminal connected to the first output terminal of the amplifier 230 through first and second resistors R21 and R22, and an inverting input terminal connected to the second output terminal of the amplifier 230 through third and fourth resistors R23 and R24.

The second amplifier A2 may provide a DC offset bias voltage Sdcoc_bias through fifth and sixth resistors R25 and R26 connected between a connection node of the first and second resistors R21 and R22 and a connection node of the third and fourth resistors R23 and R24.

In addition, the second amplifier A2 may include a first capacitor circuit C21 connected between the non-inverting input terminal and the second output terminal of the DC offset cancelling circuit 250, and a second capacitor circuit C22 connected between the inverting input terminal and the first output terminal of the DC offset cancelling circuit 250.

As an example, the first capacitor circuit C21 and the second capacitor circuit C22 include at least one capacitor element, and are implemented as circuits in which capacitance is varied based on the first control signal SC1.

Referring to FIG. 5, the DC offset cancelling circuit 250 may receive an output signal of the amplifier 230 and have a high amplification factor, and frequency characteristics of the DC offset cancelling circuit 250 may have low-pass filter characteristics.

Here, capacitances of the first capacitor circuit C21 and the second capacitor circuit C22 of the DC offset cancelling circuit 250 are adjusted based on the first control signal SC1, and since the frequency band Fbw_dcos (FIG. 7) by the DC offset cancelling circuit 250 is determined by the capacitance of the first capacitor circuit C21 and an effective resistance value Reff to be describe below, the frequency band Fbw_dcos (FIG. 7) of the signal provided to the input terminal of the amplifier 230 may be thus adjusted by the DC offset cancelling circuit 250.

In addition, the DC offset bias voltage Sdcoc_bias may be provided to the envelope output circuit 300 and may be used to cancel a DC offset from the DC offset bias voltage Sdcoc_bias.

In addition, the DC offset cancelling circuit 250 needs to operate at a low frequency (<10 kHz). To this end, large resistance and high capacitance may be used. However, in this case, since there is a limit to implement capacitance on an integrated circuit (IC), the DC offset cancelling circuit 250 may include resistor circuits R23, R24, and R26 of a T structure connected to the non-inverting input terminal of the second amplifier A2, as illustrated in FIG. 5, and make an effective resistance value Reff by the resistor circuits R23, R24, and R26 of the T structure very large.

The effective resistance value Reff may be expressed as in the following Equation 2.

$$\text{Reff} = R24 * (1 + R23(R24 + R26)/(R24 * R26))$$ [Equation 2]

In Equation 2, the effective resistance value Reff may adjust and increase a value of the fourth resistor R24 based on values of the third resistor R23 and the sixth resistor R26.

For example, in a case in which the values of the third resistor R23 and the fourth resistor R24 are 10 k ohm and the value of the sixth resistor R26 is 100 ohm, the effective resistance value Reff may be 1.02M ohm, which is 102 times higher than the conventional resistance value of 10 k ohm. As described above, since an effective large resistance value may be realized based on a resistor having a small resistance value, the 3 dB frequency of the DC offset cancelling circuit 250 may be designed to have a bandwidth of a very low frequency band.

In addition, the frequency characteristics of the DC offset cancelling circuit 250 itself have a structure of a low pass filter, but as described above, in the case in which the opposite phases are added at the input terminal when the DC offset cancelling circuit 250 is connected to the amplifier 230, the frequency characteristics of the DC offset cancelling circuit 250 may have a structure of a high pass filter.

Since the amplifier 230 has the structure of the low pass filter, overall frequency characteristics of the envelope amplifier circuit 200 may have characteristics of a band pass filter. Therefore, since the envelope amplifier circuit has a structure for only filtering and amplifying a specific bandwidth signal of an input signal, unwanted peripheral noise signals may be cancelled.

Figure 6:
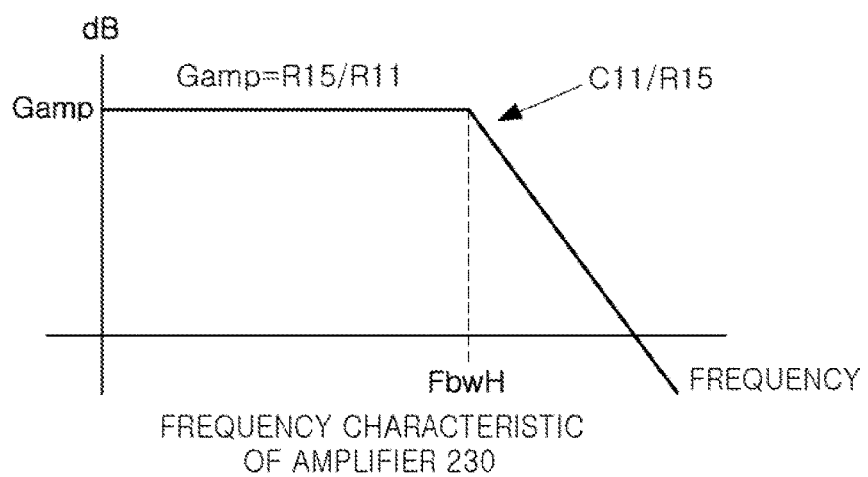
FIG. 6 is a frequency characteristic view of an example of an amplifier.
Figure 7:
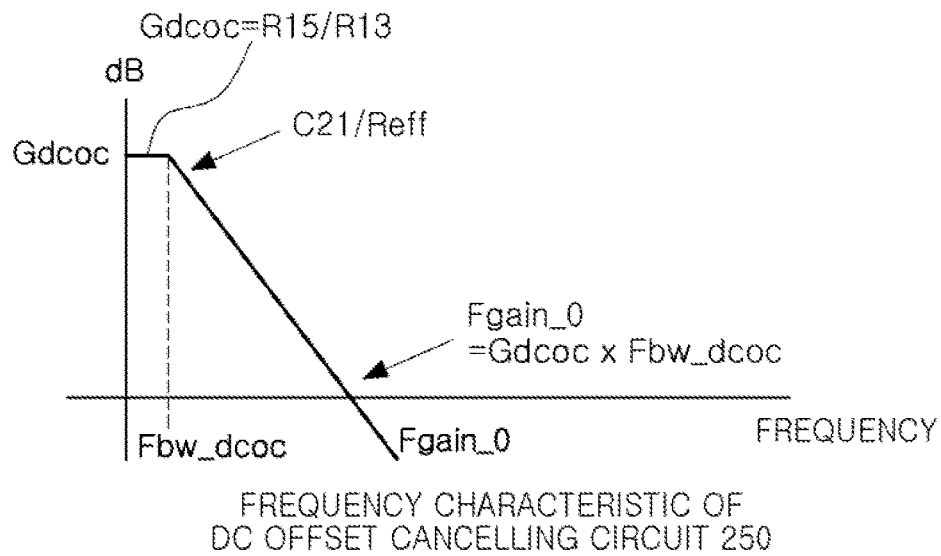
FIG. 7 is a frequency characteristic view of an example of a DC offset cancelling circuit.
Figure 8:
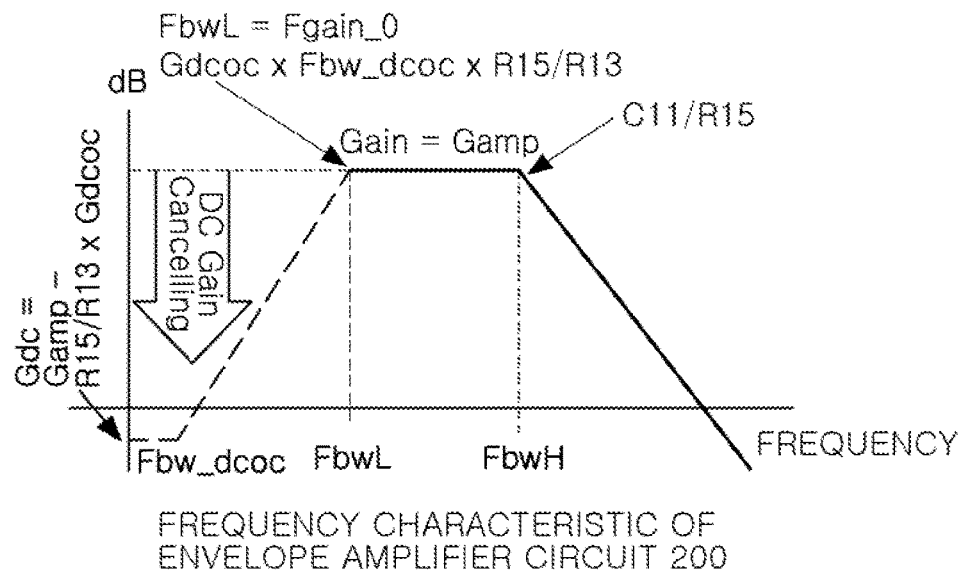
FIG. 8 is a frequency characteristic view of an example of an envelope amplifier circuit.

FIGS. 6, 7, and 8 are frequency response characteristic graphs illustrating an operation of the envelope amplifier circuit.

FIG. 6 is a frequency characteristic view of an example of an amplifier of the present disclosure.

Referring to FIG. 6, a gain Gamp of the amplifier 230 may be determined by the first resistor R11 and the fifth resistor R15, and an upper frequency FbwH of the bandwidth may be determined by the fifth resistor R15 and the first capacitor circuit C11.

FIG. 7 is a frequency characteristic view of an example of a DC offset cancelling circuit according to the present disclosure.

Referring to FIG. 7, a gain Gdcoc of the DC offset cancelling circuit 250 may be determined by the third resistor R13 and the fifth resistor R15, and the bandwidth frequency Fbw_dcoc thereof may be determined by the effective resistance value Reff and the first capacitor circuit C21. In addition, a gain bandwidth product Fgain_0 may be determined by the gain Gdcoc and the bandwidth frequency Fbw_dcoc of the DC offset cancelling circuit 250.

FIG. 8 is a frequency characteristic view of an example of an envelope amplifier circuit according to the present disclosure.

The frequency characteristic view illustrated in FIG. 8 shows overall frequency response characteristic in a case in which the amplifier 230 and the DC offset cancelling circuit 250 are connected to each other.

Referring to FIGS. 6 through 8, frequency response characteristic of the amplifier 230 illustrated in FIG. 6 and frequency response characteristic of the DC offset cancelling circuit 250 illustrated in FIG. 7 may be offset with each other, which finally results in characteristic of the band pass filter as illustrated in FIG. 8.

Referring to FIG. 8, the envelope amplifier circuit 200 has a characteristic of a band pass filter that selectively amplifies only a desired frequency band of the input signal and cancels other noises, thereby acquiring more robust characteristic for noise.

In addition, a DC gain may be cancelled by canceling the DC offset. As a result, a circuit DC offset caused by process/supply voltage/temperature (PST) may be cancelled, thus, ensuring that an operation may be more stably performed. In addition, by using a single signal or a differential signal as an input signal source, the range of applications may be expanded.

In addition, by controlling the amplifier 230 and the DC offset cancelling circuit 250, it is possible to appropriately cope with a change in characteristic of the PA.

The amplified signal Samp output from the envelope amplifier circuit 200 may be a signal in which the envelope signal and the DC bias voltage are added to each other, and in order to output only a desired envelope signal from the output, the DC bias voltage may be cancelled using the DC offset bias voltage Sdcoc_bias. This will be described with reference to FIGS. 9 and 10.

Figure 9:
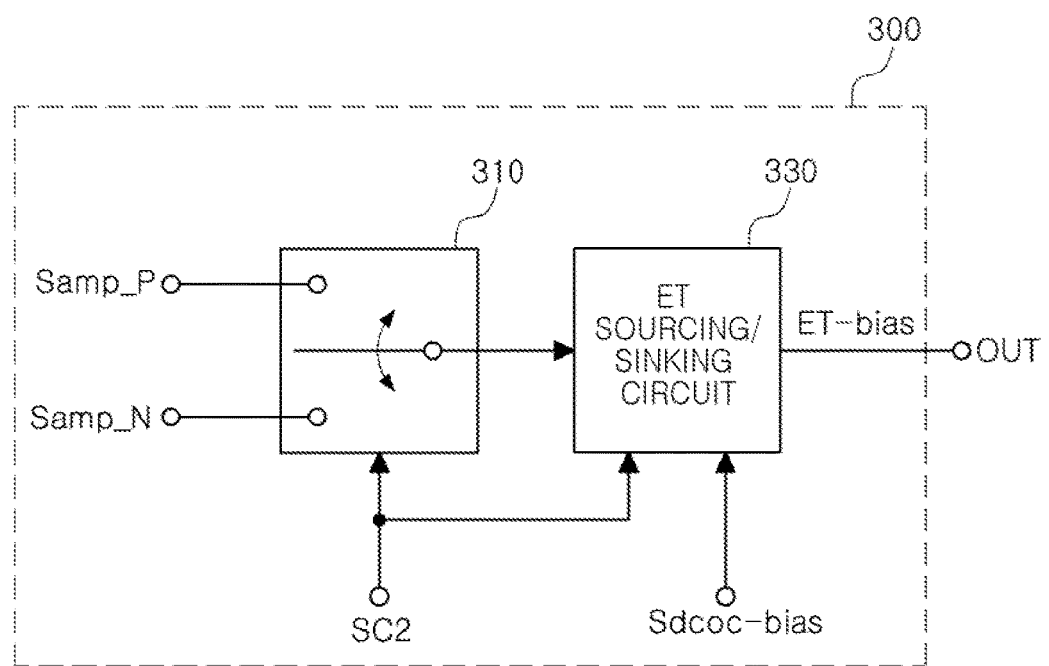
FIG. 9 is a schematic view of an example of an envelope output circuit.

FIG. 9 is a schematic view of an example of an envelope output circuit according to the present disclosure.

Referring to FIG. 9, the envelope output circuit 300 includes a selection circuit 310 and an ET sourcing/sinking circuit 330.

The selection circuit 310 may select a signal of the first signal Samp_P and the second signal Samp_N of the amplified signal Samp in response to the second control signal SC2.

The ET sourcing/sinking circuit 330 may generate an ET bias current ET_bias based on the signal selected by the selection circuit 310.

As an example, when the selection circuit 310 selects the first signal Samp_P, the ET sourcing/sinking circuit 330 performs a sourcing operation and provides the ET bias signal in phase to be matched to an envelope.

Unlike the selection of the first signal Samp_P, when the selection circuit 310 selects the second signal Samp_N, the ET sourcing/sinking circuit 330 performs a sinking operation and provides the ET bias signal in an opposite phase to an envelope.

Figure 10:
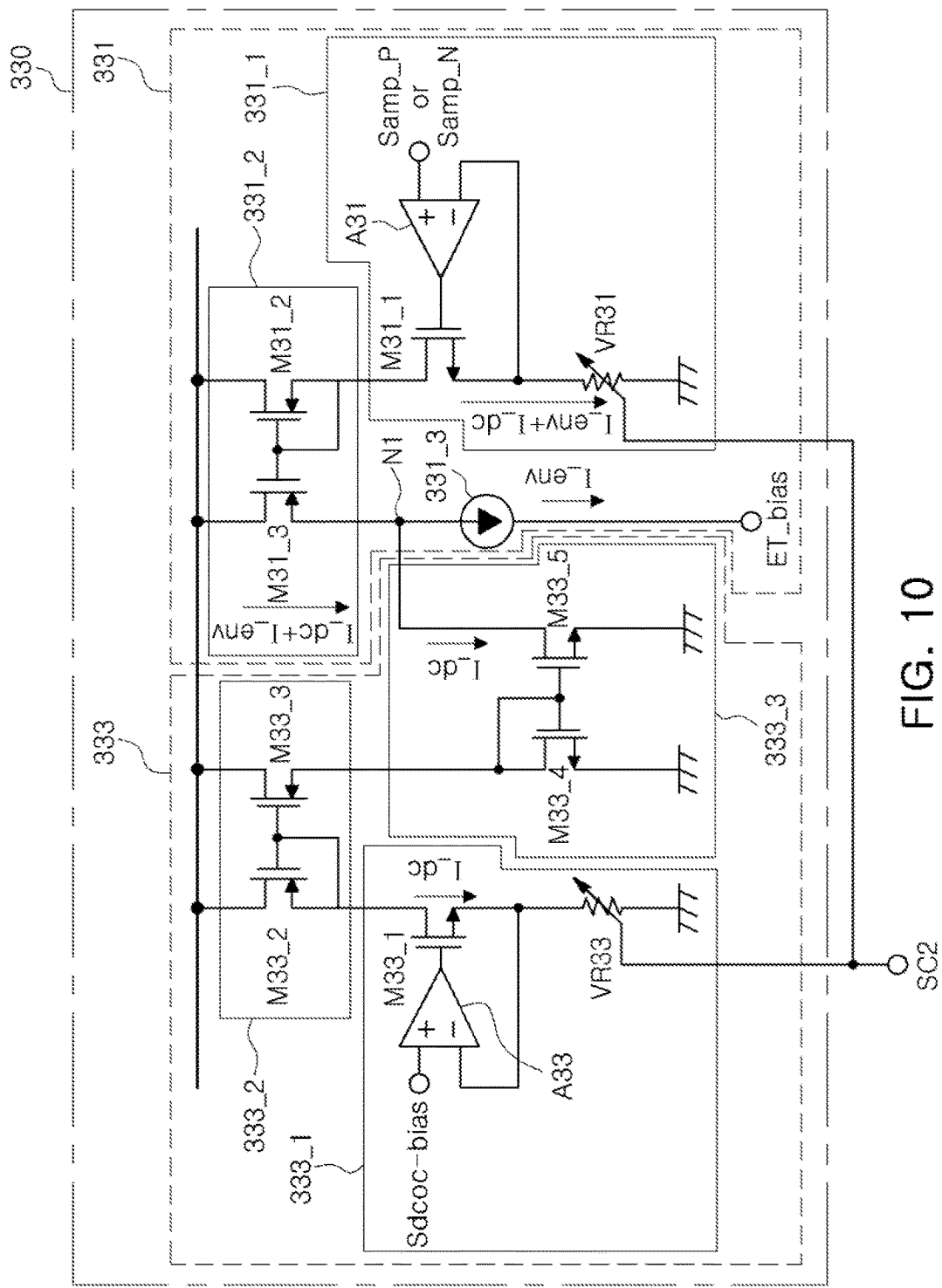
FIG. 10 is a schematic view of an example of an ET sourcing/sinking circuit.

FIG. 10 is a schematic view of an example of an ET sourcing/sinking circuit according to the present disclosure.

Referring to FIG. 10, the ET sourcing/sinking circuit 330 may include an ET current generation circuit 331 and a DC bias cancel circuit 333.

The ET current generation circuit 331 converts a voltage selected by a selection circuit 310 into the ET bias current ET_bias and adjusts the ET bias current ET_bias in response to the second control signal SC2.

The DC bias cancel circuit 333 converts the DC offset bias voltage Sdcoc_bias into the ET bias current ET_bias and cancels the direct current I_dc from the ET bias current ET_bias.

As an example, the ET current generation circuit 331 includes a first voltage/current conversion circuit 331_1, a first current mirror circuit 331_2, and a first current source circuit 331_3.

The first voltage/current conversion circuit 331_1 includes a first operational amplifier A31, a first metal oxide semiconductor (MOS) transistor M31_1, and a first variable resistor circuit VR31. The first operational amplifier A31 converts a voltage of an input amplified signal Samp (Samp_P or Samp_N) into a current I_dc+I_env using the first variable resistor circuit VR31.

The first current mirror circuit 331_2 includes a second MOS transistor M31_2 and a third MOS transistor M31_3 connected between a power source terminal and the first MOS transistor M31_1 to mirror a current I_dc+I_env flowing through the second MOS transistor M31_2 to a current I_dc+I_env flowing through the third MOS transistor M31_3.

Here, the current mirrored from the first current mirror circuit 331_2 may be adjusted by a ratio of sizes of the second MOS transistor M31_2 and the third MOS transistor M31_3.

The first current source circuit 331_3 may provide a more stable ET bias current I_bias to an output terminal using the current from the second current mirror circuit 331_2.

As an example, the DC bias cancel circuit 333 includes a second voltage/current conversion circuit 333_1, a second current mirror circuit 333_2, and a third current mirror circuit 333_3.

The second voltage/current conversion circuit 333_1 includes a second operational amplifier A33, a fourth MOS transistor M33_1, and a second variable resistor circuit VR33. The second operational amplifier A33 converts an input DC offset bias voltage Sdcoc_bias into the current I_dc using the second variable resistor circuit VR33.

The second current mirror circuit 333_2 includes a fifth MOS transistor M33_2 and a sixth MOS transistor M33_3 connected between the power source terminal and the fourth MOS transistor M33_1 to mirror a current I_dc flowing through the fifth MOS transistor M33_2 to a current I_dc flowing through the sixth MOS transistor M33_3.

Here, the current mirrored from the second current mirror circuit 333_2 may be adjusted by a ratio of sizes of the fifth MOS transistor M33_2 and the sixth MOS transistor M33_3.

The third current mirror circuit 333_3 includes a seventh MOS transistor M33_4 connected between the sixth MOS transistor M33_3 and a ground, and an eighth MOS transistor M33_5 connected between a connection node N1 between the first current source circuit 331_3 and the third MOS transistor M31_3 and the ground, and forming a current mirror with the seventh MOS transistor M33_4. The third current mirror circuit 333_3 may mirror a current I_dc flowing through the seventh MOS transistor M33_4 to a current I_dc flowing through the eighth MOS transistor M33_5. Here, since the current I_dc flowing to the ground through the eighth MOS transistor M33_5 is a current branched from the current I_dc+I_env flowing through the third MOS transistor M31_3, the current I_dc corresponding to the DC offset may be canceled from the current I_dc+I_env flowing through the third MOS transistor M31_3.

Here, the current mirrored from the third current mirror circuit 333_3 may be adjusted by a ratio of sizes of the seventh MOS transistor M33_4 and the eighth MOS transistor M33_5.

The first variable resistor circuit VR31 and the second variable resistor circuit VR33 may be implemented as a circuit in which a resistance value thereof is linearly adjusted by the second control signal SC2. Accordingly, operation characteristics of the ET current generation circuit 331 and the DC bias cancel circuit 333 may be linearly adjusted to be suitable for characteristic of the power amplifier PA.

As an example, each of the first variable resistor circuit VR31 and the second variable resistor circuit VR33 include a plurality of switches and a plurality of resistor elements, but is not limited thereto.

Figure 11:
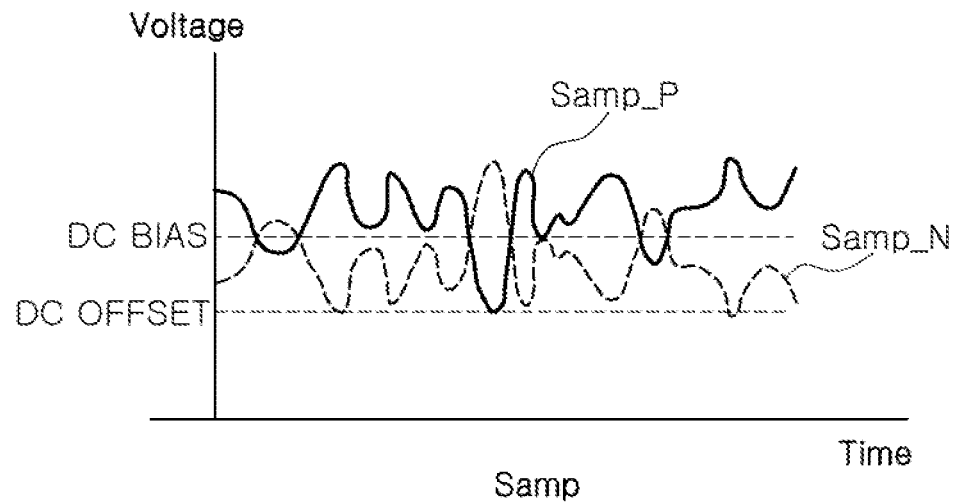
FIG. 11 is a schematic view of an example of an amplified signal.
Figure 12:
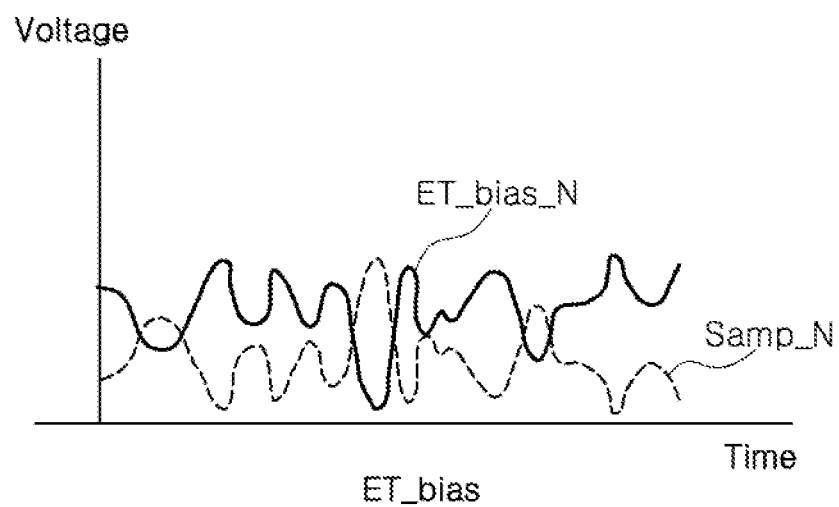
FIG. 12 is a schematic view of an example of an ET bias current.

FIG. 11 is a schematic view of an example of an amplified signal according to the present disclosure. FIG. 12 is a schematic view of an example of an ET_bias current according to the present disclosure.

Referring to FIG. 11, the amplified signal Samp output from the envelope amplifier circuit 200 may include the first signal Samp_P and the second signal Samp_N corresponding to the envelope, and may also include a DC bias voltage and a DC offset.

Referring to FIG. 12, the ET_bias current ET_bias output from the envelope output circuit 300 may include the first signal ET_bias P and the second signal ET_bias N corresponding to the envelope, but may not include the DC bias voltage and the DC offset.

As set forth above, according to the examples in the present disclosure, since the envelope tracking bias circuit may provide the ET_bias suitable for characteristics of the PA and may cancel the DC offset, it may exhibit characteristics which is insensitive to the process conversion.

In addition, in the structure using the RF signal and the ET_bias, the envelope tracking bias circuit may selectively use the sourcing scheme or the sinking scheme for the detected envelope signal according to characteristic of the PAIC and may apply the sourcing scheme or the sinking scheme irrespective of the form of an input signal, thereby being more applicable to more applications. Further, the envelope tracking bias circuit may be designed to vary the amplitude of the ET_bias signal, thereby extending the application range in the PAIC.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An envelope tracking (ET) bias circuit, comprising:
 an envelope detection circuit configured to detect an envelope of an input signal, and output an envelope signal based on the detected envelope of the input signal;
 an envelope amplifier circuit configured to differentially amplify the envelope signal in response to a first control signal and cancel a direct current (DC) offset of the envelope signal to output an amplified signal from which the DC offset is canceled; and an envelope output circuit configured to generate an ET bias current by selecting either one of a negative signal of the amplified signal and a positive signal of the amplified signal in response to a second control signal, wherein the envelope output circuit comprise an ET sourcing/sinking circuit configured to generate the ET bias current based on the selected one of the first signal and the second signal.

2. The envelope tracking bias circuit of claim 1, wherein the envelope signal output by the envelope detection circuit is a differential envelope signal, and the envelope amplifier circuit comprises:
an amplifier configured to differentially amplify the differential envelope signal to output a differential amplified signal; and
a DC offset cancelling circuit configured to provide the amplified signal from the amplifier to an input terminal of the amplifier to cancel the DC offset from the amplified signal output from the amplifier.

3. An envelope tracking (ET) bias circuit, comprising:
an envelope detection circuit configured to detect an envelope of an input signal, and output an envelope signal based on the detected envelope of the input signal;
an envelope amplifier circuit configured to differentially amplify the envelope signal in response to a first control signal and cancel a direct current (DC) offset of the envelope signal to output an amplified signal from which the DC offset is canceled; and
an envelope output circuit configured to generate an ET bias current by selecting either one of a negative signal of the amplified signal and a positive signal of the amplified signal in response to a second control signal, wherein the envelope signal of the envelope detection circuit is a single envelope signal, and
the envelope amplifier circuit comprises:
a single/differential circuit configured to convert the single envelope signal into a differential envelope signal;
an amplifier configured to differentially amplify the differential envelope signal from the single/differential circuit to output a differential amplified signal; and
a DC offset cancelling circuit configured to provide the amplified signal from the amplifier to an input terminal of the amplifier to cancel the DC offset from the amplified signal output from the amplifier.

4. The envelope tracking bias circuit of claim 2, wherein the amplifier comprises a first amplifier having a non-inverting input terminal configured to receive a first signal of the differential envelope signal through a first resistor, and an inverting input terminal configured to receive a second signal of the differential envelope signal through a second resistor, the first amplifier is configured to receive a second signal of a DC offset cancel signal from the DC offset cancelling circuit through a third resistor and the non-inverting input terminal, and receive a first signal of the DC offset cancel signal through a fourth resistor and the inverting input terminal, and the first amplifier comprises:
a fifth resistor connected between the non-inverting input terminal and a second output terminal;
a sixth resistor connected between the inverting input terminal and a first output terminal;
a first capacitor connected between the non-inverting input terminal and the second output terminal; and
a second capacitor connected between the inverting input terminal and the first output terminal.

5. The envelope tracking bias circuit of claim 3, wherein the amplifier comprises a first amplifier having a non-inverting input terminal receiving a first signal of the differential envelope signal through a first resistor, and an inverting input terminal configured to receive a second signal of the differential envelope signal through a second resistor, the first amplifier is configured to receive a second signal of a DC offset cancel signal from the DC offset cancelling circuit through a third resistor and the non-inverting input terminal, and receive a first signal of the DC offset cancel signal through a fourth resistor and the inverting input terminal, and the first amplifier comprises:
a fifth resistor connected between the non-inverting input terminal and a second output terminal;
a sixth resistor connected between the inverting input terminal and a first output terminal;
a first capacitor connected between the non-inverting input terminal and the second output terminal; and
a second capacitor connected between the inverting input terminal and the first output terminal.

6. The envelope tracking bias circuit of claim 2, wherein the DC offset cancelling circuit comprises a second amplifier having a non-inverting input terminal connected to a first output terminal of the amplifier through first and second resistors, and an inverting input terminal connected to a second output terminal of the amplifier through third and fourth resistors, the second amplifier is configured to provide a DC offset bias voltage through fifth and sixth resistors connected between a connection node of the first and second resistors and a connection node of the third and fourth resistors, and the second amplifier comprises:
a first capacitor connected between the non-inverting input terminal and a second output terminal of the DC offset cancelling circuit; and
a second capacitor connected between the inverting input terminal and a first output terminal of the DC offset cancelling circuit.

7. The envelope tracking bias circuit of claim 3, wherein the DC offset cancelling circuit comprises a second amplifier having a non-inverting input terminal connected to a first output terminal of the amplifier through first and second resistors, and an inverting input terminal connected to a second output terminal of the amplifier through third and fourth resistors, the second amplifier is configured to provide a DC offset bias voltage through fifth and sixth resistors connected between a connection node of the first and second resistors and a connection node of the third and fourth resistors, and the second amplifier comprises:
a first capacitor connected between the non-inverting input terminal and a second output terminal of the DC offset cancelling circuit; and
a second capacitor connected between the inverting input terminal and a first output terminal of the DC offset cancelling circuit.

8. The envelope tracking bias circuit of claim 2, wherein the envelope output circuit comprises:
a selection circuit configured to select either one of a first signal and a second signal of the amplified signal in response to the second control signal.

9. The envelope tracking bias circuit of claim 3, wherein the envelope output circuit comprises:
   a selection circuit configured to select either one of a first signal and a second signal of the amplified signal in response to the second control signal; and
   an ET sourcing/sinking circuit configured to generate the ET bias current based on the selected one of the first signal and the second signal.

10. The envelope tracking bias circuit of claim 8, wherein the ET sourcing/sinking circuit comprises:
    an ET current generation circuit configured to convert a voltage selected by the selection circuit into the ET bias current and adjust the ET bias current in response to the second control signal; and
    a DC bias cancel circuit configured to convert the DC offset bias voltage into the ET bias current and cancel the direct current from the ET bias current.

11. The envelope tracking bias circuit of claim 9, wherein the ET sourcing/sinking circuit comprises:
    an ET current generation circuit configured to convert a voltage selected by the selection circuit into the ET bias current and adjust the ET bias current in response to the second control signal; and
    a DC bias cancel circuit configured to convert the DC offset bias voltage into the ET bias current and cancel the direct current from the ET bias current.

12. An envelope tracking (ET) bias circuit, comprising:
    an envelope detection circuit configured to detect an envelope from an input signal, and output an envelope signal based on the detected envelope;
    an envelope amplifier circuit configured to differentially amplify the envelope signal in response to a first control signal, and cancel a direct current (DC) offset of the envelope signal to output an amplified signal from which the DC offset is canceled;
    an envelope output circuit configured to generate an ET bias current by selecting either one of a negative signal of the amplified signal and a positive signal of the amplified signal in response to the second control signal; and
    a control circuit configured to generate the first control signal and the second control signal to control the envelope amplifier circuit and the envelope output circuit based on a characteristic parameter factor of a power amplifier,
    wherein the envelope output circuit comprise an ET sourcing/sinking circuit configured to generate the ET bias current based on the selected one of the negative signal and the positive signal.

13. The envelope tracking bias circuit of claim 12, wherein the envelope signal of the envelope detection circuit is a differential envelope signal, and
    the envelope amplifier circuit comprises:
        an amplifier configured to differentially amplify the differential envelope signal to output a differential amplified signal; and
        a DC offset cancelling circuit configured to provide the amplified signal from the amplifier to an input terminal of the amplifier to cancel the DC offset from the amplified signal output from the amplifier.

14. The envelope tracking bias circuit of claim 12, wherein the envelope signal of the envelope detection circuit is a single envelope signal, and
    the envelope amplifier circuit comprises:
        a single/differential circuit configured to convert the single envelope signal into a differential envelope signal;
        an amplifier configured to differentially amplify the differential envelope signal from the single/differential circuit to output a differential amplified signal; and
        a DC offset cancelling circuit configured to provide the amplified signal from the amplifier to an input terminal of the amplifier to cancel the DC offset from the amplified signal output from the amplifier.

15. The envelope tracking bias circuit of claim 13, wherein the amplifier comprises a first amplifier having a non-inverting input terminal configured to receive a first signal of the differential envelope signal through a first resistor, and an inverting input terminal configured to receive a second signal of the differential envelope signal through a second resistor,
    the first amplifier is configured to receive a second signal of a DC offset cancel signal from the DC offset cancelling circuit through a third resistor and the non-inverting input terminal, and receive a first signal of the DC offset cancel signal through a fourth resistor and the inverting input terminal, and
    the first amplifier comprises:
        a fifth resistor connected between the non-inverting input terminal and a second output terminal;
        a sixth resistor connected between the inverting input terminal and a first output terminal;
        a first capacitor connected between the non-inverting input terminal and the second output terminal; and
        a second capacitor connected between the inverting input terminal and the first output terminal.

16. The envelope tracking bias circuit of claim 14, wherein the amplifier comprises a first amplifier having a non-inverting input terminal configured to receive a first signal of the differential envelope signal through a first resistor, and an inverting input terminal configured to receive a second signal of the differential envelope signal through a second resistor,
    the first amplifier is configured to receive a second signal of a DC offset cancel signal from the DC offset cancelling circuit through a third resistor and the non-inverting input terminal, and receive a first signal of the DC offset cancel signal through a fourth resistor and the inverting input terminal, and
    the first amplifier comprises:
        a fifth resistor connected between the non-inverting input terminal and a second output terminal;
        a sixth resistor connected between the inverting input terminal and a first output terminal;
        a first capacitor connected between the non-inverting input terminal and the second output terminal; and
        a second capacitor connected between the inverting input terminal and the first output terminal.

17. The envelope tracking bias circuit of claim 13, wherein the DC offset cancelling circuit comprises a second amplifier having a non-inverting input terminal connected to a first output terminal of the amplifier through first and second resistors, and an inverting input terminal connected to a second output terminal of the amplifier through third and fourth resistors,
    the second amplifier is configured to provide a DC offset bias voltage through fifth and sixth resistors connected between a connection node of the first and second resistors and a connection node of the third and fourth resistors, and the second amplifier comprises:
- a first capacitor connected between the non-inverting input terminal and a second output terminal of the DC offset cancelling circuit; and
- a second capacitor connected between the inverting input terminal and a first output terminal of the DC offset cancelling circuit.

18. The envelope tracking bias circuit of claim 14, wherein the DC offset cancelling circuit comprises a second amplifier having a non-inverting input terminal connected to a first output terminal of the amplifier through first and second resistors, and an inverting input terminal connected to a second output terminal of the amplifier through third and fourth resistors, the second amplifier is configured to provide a DC offset bias voltage through fifth and sixth resistors connected between a connection node of the first and second resistors and a connection node of the third and fourth resistors, and the second amplifier comprises:
- a first capacitor connected between the non-inverting input terminal and a second output terminal of the DC offset cancelling circuit; and
- a second capacitor connected between the inverting input terminal and a first output terminal of the DC offset cancelling circuit.

19. The envelope tracking bias circuit of claim 13, wherein the envelope output circuit comprises:
- a selection circuit configured to select either one of a first signal and a second signal of the amplified signal in response to the second control signal.

20. The envelope tracking bias circuit of claim 14, wherein the envelope output circuit comprises:
- a selection circuit configured to select either one of a first signal and a second signal of the amplified signal in response to the second control signal.

21. The envelope tracking bias circuit of claim 19, wherein the ET sourcing/sinking circuit comprises:
- an ET current generation circuit configured to convert a voltage selected by the selection circuit into the ET bias current and adjust the ET bias current in response to the second control signal; and
- a DC bias cancel circuit configured to convert the DC offset bias voltage into the ET bias current and cancel the direct current from the ET bias current.

22. The envelope tracking bias circuit of claim 20, wherein the ET sourcing/sinking circuit comprises:
- an ET current generation circuit configured to convert a voltage selected by the selection circuit into the ET bias current and adjust the ET bias current in response to the second control signal; and
- a DC bias cancel circuit configured to convert the DC offset bias voltage into the ET bias current and cancel the direct current from the ET bias current.

* * * * *